US005712634A

United States Patent [19]

Janssen

[11] Patent Number: 5,712,634

[45] Date of Patent: Jan. 27, 1998

[54] DIGITAL DRIVING OF MATRIX DISPLAY DRIVER BY CONVERSION AND CAPACITIVE CHARGING

[75] Inventor: Peter Johannes Michiel Janssen, Scarborough, N.Y.

[73] Assignee: Philips Electronics North American Corp., N.Y., N.Y.

[21] Appl. No.: 561,961

[22] Filed: Nov. 22, 1995

[51] Int. Cl.[6] .................................................. H03M 1/66

[52] U.S. Cl. .................................................. 341/144; 341/150

[58] Field of Search .................................. 341/144, 145, 341/150, 152

[56] References Cited

U.S. PATENT DOCUMENTS

| | | | |
|---|---|---|---|
| 3,823,396 | 7/1974 | Lode | 341/145 |
| 4,388,612 | 6/1983 | Takagi et al. | 341/145 |
| 4,584,568 | 4/1986 | Zo Morrodi | 340/347 |

FOREIGN PATENT DOCUMENTS

| | | | |
|---|---|---|---|
| 62-27718 | 12/1987 | Japan | H03M 1/66 |

OTHER PUBLICATIONS

Okada et al., "4.2: TFT–LCDs Using Newly Designed 6–bit Digital Data Drivers", SID 93 Digest, pp. 11–14.

Okada et al., "23.1: An 8–bit Digital Data Driver for AMLCDs", SID 94 Digest, pp. 347–350.

Conner et al., "23.2: Low–Power 6–bit Column Driver for AMLCDs", SID 94 Digest, pp. 351–354.

*Primary Examiner*—Howard L. Williams

*Attorney, Agent, or Firm*—Robert J. Kraus

[57] ABSTRACT

A driver for a matrix display successively stores digital data codes. During a first time interval, the driver charges a capacitor coupled to its output to a voltage level represented by the most-significant bits of a stored data code. During a second time interval, the driver shifts the voltage on the capacitor by a magnitude represented by the least significant bits of the stored data code.

13 Claims, 3 Drawing Sheets

DIGITAL DRIVING OF MATRIX DISPLAY DRIVER BY CONVERSION AND CAPACITIVE CHARGING

BACKGROUND OF THE INVENTION

1. Field of the invention

The invention relates to data-line drivers for matrix displays and, in particular, to such drivers which convert digital data signals to analog data signals.

2. Description of Related Art

Matrix displays, such as the liquid-crystal display (LCD), require the application of data in the form of analog signals to their data lines to determine the gray scale or brightness of the various pixels in the image displayed. Often, the source of this data is a digital signal from a source such as a computer or a modem. Even television signals are sometimes converted to digital form to take advantage of digital processing techniques, such as data compression techniques, which eliminate interference and produce better images. Thus, there is a need for display drivers which can convert digital data signals to analog data signals.

One example of such a display driver is described by H. Okada et al. in An 8-bit Digital Data Driver for AMLCDs, SID 94 Digest, pages 347–350. This article describes a circuit which converts a digital data signal to an analog data signal in two steps. In the first step, the highest-order (most-significant) bits of a digital data code received by the driver are converted to an analog voltage level by selecting one of a plurality of predetermined voltage levels. In the second step, the lowest-order least-significant) bits of the digital data code determine a duty cycle for switching between the selected voltage level and the next higher one of the predetermined voltage levels. In effect, this method produces an interpolated voltage level which should correspond to the level represented by the full digital data code.

The driver described in the previous paragraph relies on low-pass filtering, to be provided naturally by intrinsic capacitances and resistances of the display being driven, to smooth the switched signal to the interpolated level. However, for displays using fast refresh rates, such as high resolution or color sequential displays, the duty cycle switching rate would necessarily become quite high and would substantially increase loading of the data lines.

Another type of driver for converting digital data signals to analog data signals employs a plurality of binary-weighted capacitors for performing the conversion. Not only do these capacitors occupy substantial areas of the display, but also the capacitances for each data line of the driven display must precisely match those of the other data lines. If they do not, the image brightness from line to line will vary in accordance with variations in the respective driver capacitances.

SUMMARY OF THE INVENTION

It is an object of the invention to provide a digital display driver which substantially reduces both the area needed for capacitance and the precision required for the capacitance.

In accordance with the invention, a digital display driver is provided which includes storage means for successively storing digital data codes. Conversion means is coupled to the storage means for converting portions of each stored digital data code to analog signal levels. During a first time interval the conversion means produces a first analog signal level having a magnitude represented by at least a first bit of a stored digital data code. During a second time interval, the conversion means produces a second analog signal level having a magnitude represented by at least a second bit of the stored code. The digital display driver also includes a capacitive means having a first electrode coupled to an output of the driver and coupling means for coupling the conversion means to the capacitive means. During the first time interval the coupling means effects charging of the capacitive means to a voltage determined by the first analog signal level. During the second time interval, the coupling means effects shifting of the first electrode voltage by a magnitude determined by the second analog signal level.

In one preferred embodiment of the invention, the capacitive means comprises a capacitor having the first and a second electrode. The voltage shift, during the second time interval, at the first electrode is achieved by changing a voltage applied to the second electrode of the capacitive means by the magnitude determined by the second analog signal level.

In another preferred embodiment of the invention, the capacitive means comprises a first capacitor having the first electrode and a second capacitor. The voltage shift is achieved by coupling the capacitors in series to the conversion means, during the second time interval, to form a voltage divider. This enables charging of the first capacitor to a voltage not provided directly by the conversion means.

DESCRIPTION OF THE PREFERRED EMBODIMENTS

Figure 1:
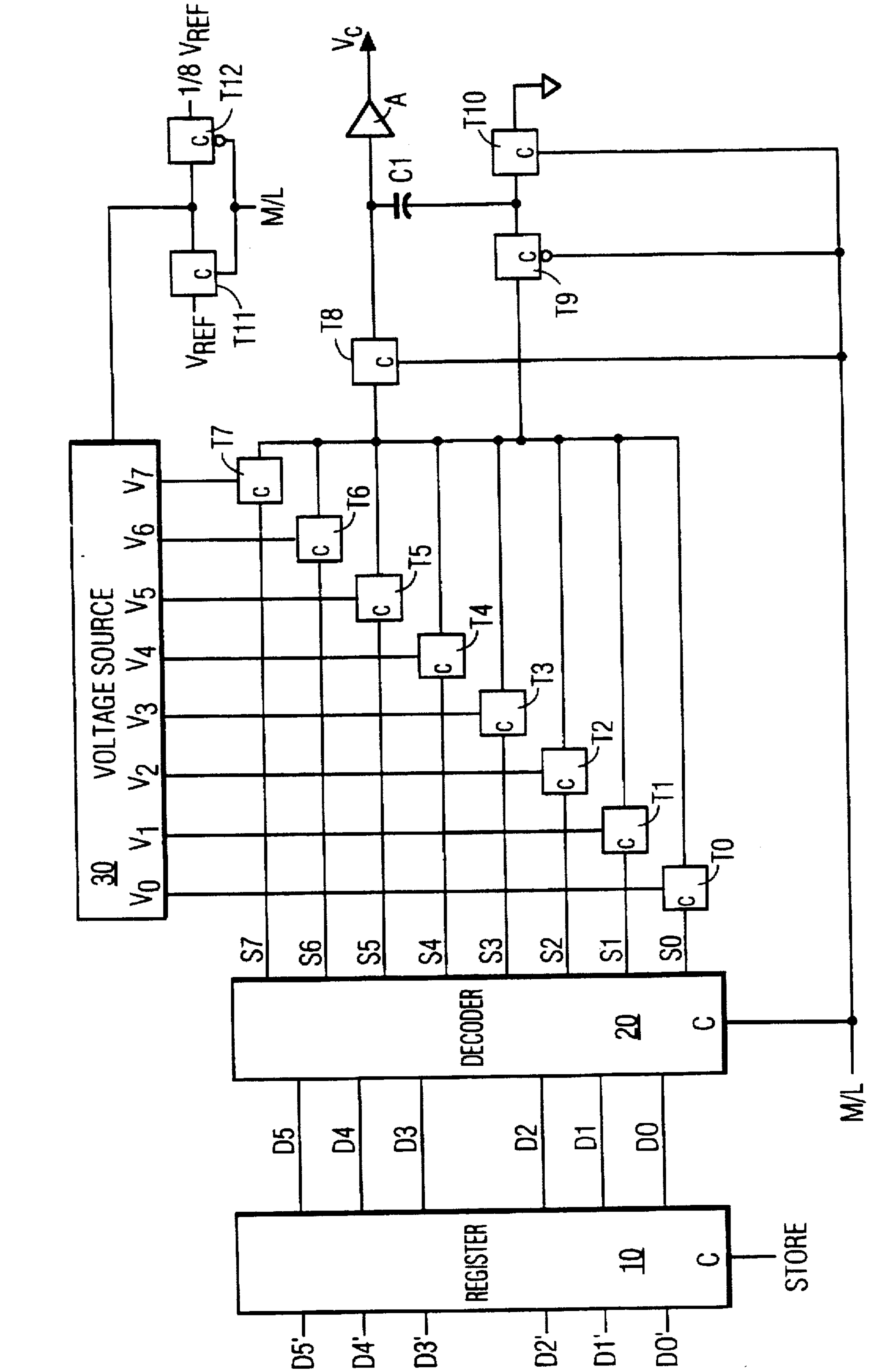
FIG. 1 is a schematic diagram of a first embodiment of a digital display driver in accordance with the invention.

The exemplary digital display driver shown in FIG. 1 provides analog data signals for one data line of a matrix display. In practice, one such driver is typically required for each data line in a display. The driver includes a multi-bit storage register 10, a voltage converter (including a decoder 20, a voltage source 30, and switches T0, T1, T2, . . . T7), a capacitor C1, a coupling arrangement (including switches T8, T9 and T10), and an output $V_C$ which preferably is coupled to the data line through a buffer amplifier A to minimize loading of the driver.

The register 10 successively stores multi-bit data codes received from a data source such as a computer or a digital video processor in a television. In this example, the data source (not shown) successively provides binary data codes to the register, each code representing a specific pixel brightness to be displayed. Each code comprises six bits, which are applied to six respective inputs of the register while the source applies a STORE timing pulse to a control terminal C of the register. This timing pulse causes the register to store each newly-applied data code D5',D4',D3', D2',D1',D0' (in place of a currently-stored code D5,D4,D3, D2,D1,D0) and to provide the code at respective outputs of the register as a new currently-stored data code. The bits in the stored code are arranged in two groups, with higher-order bits D5',D4',D3' being in a first group and lower-order bits D2',D1',D0' being in a second group.

The decoder 20 is a dual 3-bit decoder having a first set of inputs coupled to respective outputs of the register 10 for receiving the higher-order bits D5',D4',D3' and having a second set of inputs coupled to respective outputs of the register for receiving the lower-order bits D2',D1',D0'. The data source applies a timing signal M/L to a control terminal C of the decoder to control which set of decoder inputs is active. The signal M/L alternates between a high (logical ONE) state, which activates the first set of decoder inputs, and a low (logical ZERO) state, which activates the second set of decoder inputs. During each state, the decoder 20 produces a switching signal (S7, S6, S5, S4, S3, S2, S1 or S0) at one of eight respective outputs corresponding to the one of eight possible data-code values which is currently being received at the set of active decoder inputs. For example, if the higher-order set of decoder inputs is active and is receiving the code D5',D4',D3'=010 (the binary code for the number 2), the decoder will produce the switching signal S2 at its respective output.

Each of the switches T0, T1, . . . T7 has a control terminal C coupled to a respective one of the decoder outputs at which the switching signals are produced, has an input coupled to a respective one of eight voltage-producing outputs ($V_0$,$V_1$, . . . $V_7$) of the voltage source 30, and has an output. Each of the switches comprises one or more conventional semiconductor devices, such as field-effect transistors, which provide a low-impedance path from the switch input to its output whenever the respective switching signal is applied to the switch control terminal.

The voltage source 30 is a conventional voltage divider which produces voltages at the outputs $V_0$,$V_1$, . . . $V_7$ which are respective fractions N/8 of an input voltage $V_{IN}$ that is applied to an input of the voltage source. The number N corresponds to the subscript of the designation for the respective output. For example, the output $V_4$ produces a voltage which is four-eighths of the input voltage (i.e. $\frac{1}{2}V_{IN}$), and the output $V_0$ produces a voltage which is zero-eighths of the input voltage (i.e. zero volts).

Note that the input voltage $V_{IN}$ is not constant, but alternates between two different voltages $V_{REF}$ and $\frac{1}{8}V_{REF}$ which are provided via respective semiconductor switches T11 and T12, respectively. Each of these switches has a control terminal to which the signal M/L is applied, but the control terminal of switch T12 is an inverting input. In other words, it is coupled to the internal semiconductor switch via an inverter. Thus, switch T11 provides a low-impedance path to the voltage $V_{REF}$ only when the signal M/L is in a high (logical-ONE) state, and switch T12 provides a low-impedance path to the voltage $\frac{1}{8}V_{REF}$ only when the signal M/L is in a low (logical-ZERO) state.

Each of the three switches in the coupling arrangement also has a control input to which the signal M/L is applied. Switches T8 and T10 have non-inverting control inputs, but switch T9 has an inverting input and thus operates similarly to switch T12. These switches function as follows:

a) Whenever the signal M/L is in the high (logical-ONE) state: switch T8 provides a low-impedance path between a first electrode of the capacitor C1 and the outputs of the switches T0, T1, . . . T7, which are commonly connected; switch T9 is in a high-impedance state and isolates the capacitor C1 from the commonly-connected outputs of the switches T0, T1, . . . T7; and switch T10 provides a low-impedance path between a second electrode of the capacitor C1 and ground.

b) Whenever the signal M/L is in the low (logical-ZERO) state: switch T8 is in a high-impedance state and isolates the first electrode of the capacitor C1 from the commonly-connected outputs of the switches T0, T1, . . . T7; switch T9 provides a low-impedance path between the second electrode of the capacitor C1 and the commonly-connected outputs of the switches T0, T1, . . . T7; and switch T10 is in a high-impedance state and isolates the second electrode of the capacitor C1 from ground.

The first electrode of the capacitor C1 is coupled to the output $V_C$ of the display driver, via the buffer amplifier A, for providing to a data line of a display the drive voltages corresponding to the successively-stored digital data codes.

Figure 2:
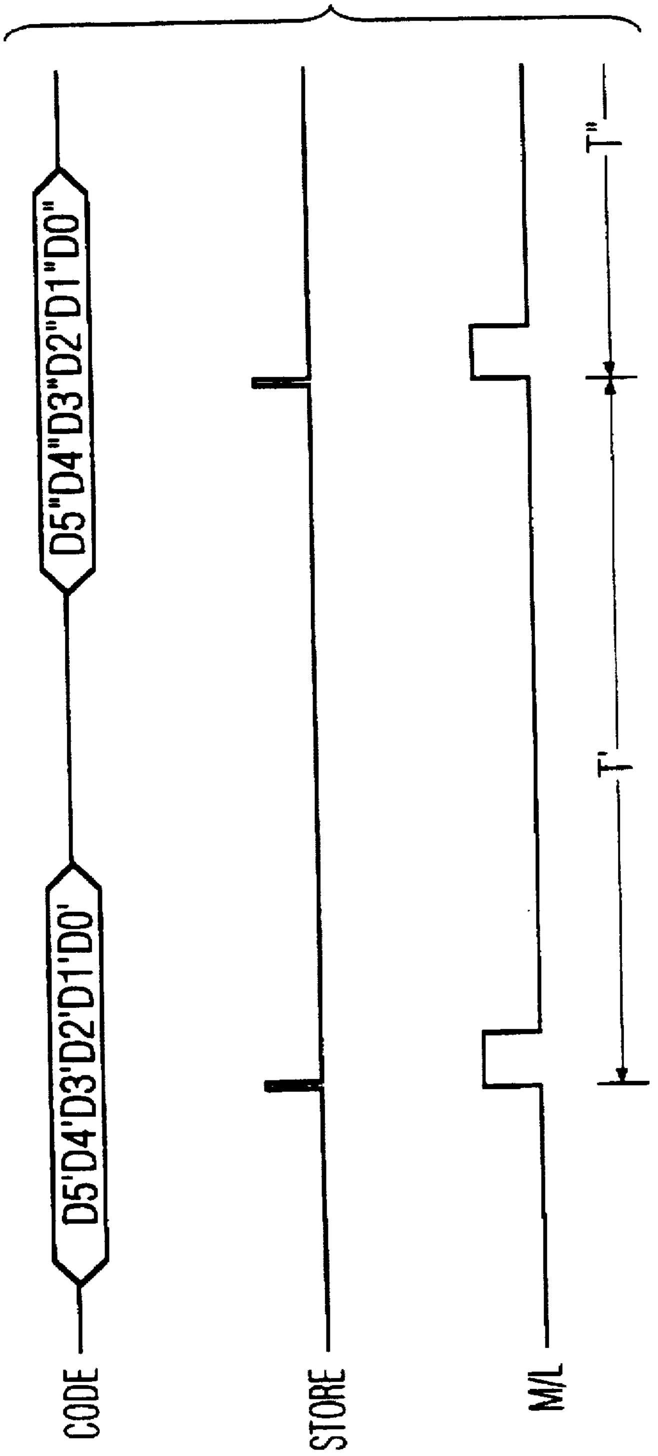
FIG. 2 is an exemplary timing diagram which is useful in explaining operation of the digital display driver.

Operation of the display driver of FIG. 1 can be better understood by referring to FIG. 2 and to the following Table I. FIG. 2 illustrates a full cycle of data-code conversion for the code D5',D4',D3',D2',D1',D0' (during a period T') followed by the beginning of conversion cycle for a successively-received code D5",D4",D3",D2",D1",D0" (during a period T"). Table I illustrates the voltages that will be produced at the outputs $V_0$,$V_1$, . . . $V_7$ during the ONE and ZERO states of the signal M/L.

TABLE I

| OUTPUT | VOLTAGE (M/L = 1) | VOLTAGE (M/L = 0) |
|---|---|---|
| $V_7$ | 7/8 $V_{REF}$ | 7/64 $V_{REF}$ |
| $V_6$ | 3/4 $V_{REF}$ | 3/32 $V_{REF}$ |
| $V_5$ | 5/8 $V_{REF}$ | 5/64 $V_{REF}$ |
| $V_4$ | 1/2 $V_{REF}$ | 1/16 $V_{REF}$ |
| $V_3$ | 3/8 $V_{REF}$ | 3/64 $V_{REF}$ |
| $V_2$ | 1/4 $V_{REF}$ | 1/32 $V_{REF}$ |
| $V_1$ | 1/8 $V_{REF}$ | 1/64 $V_{REF}$ |
| $V_0$ | 0 | 0 |

As an example, it will be assumed that the data code D5',D4',D3',D2',D1',D0' has the value 010101 and that $V_{REF}$=6.4 volts. While this data code is being applied to the inputs of the register 10, a STORE pulse is applied to the control terminal C, causing the code to be stored and applied to the inputs of the decoder 20. Simultaneously, the signal M/L changes to a high (logical ONE) state for a first part of the cycle. This causes the decoder to activate the first set of inputs, which are receiving the more-significant bits D5', D4',D3'=010. The decoder recognizes this code as having the value 2 and produces the corresponding switching signal S2, thereby causing switch T2 to provide a low-impedance path from the voltage source output $V_2$ to the input of switch T8. Because the signal M/L is in the logical ONE state, switch T8 completes a low-impedance path from the output $V_2$ to the first electrode of the capacitor C1 while switch T10 provides a low-impedance path from the second electrode of the capacitor and ground. This causes the capacitor to charge to the voltage at the output $V_2$ which, according to Table I is $\frac{1}{4}$ $V_{REF}$ or 1.6 volts.

During a second part of the data-code-conversion cycle T', the signal M/L changes to a low (logical ZERO) state causing the decoder to activate the second set of inputs, which are receiving the less-significant bits D2',D1',D0'= 101. The decoder recognizes this code as having the value 5 and produces the corresponding switching signal S5, thereby causing switch T5 to provide a low-impedance path from the voltage source output $V_5$ to the input of switch T9. Because the signal M/L is now in the logical ZERO state, switch T9 completes a low-impedance path from the output $V_5$ of the voltage source to the second electrode of the capacitor while switch T10 isolates this electrode from ground and while switch T8 isolates the first electrode from the voltage source, effectively causing it to "float". Thus, the voltage of the first electrode changes by the magnitude of the voltage at the output $V_5$ (i.e. $\frac{5}{64}$ $V_{REF}$), thus providing at the output $V_C$ the voltage $\frac{1}{4}V_{REF}$+$\frac{5}{64}$ $V_{REF}$ or 2.1 volts.

Figure 3:
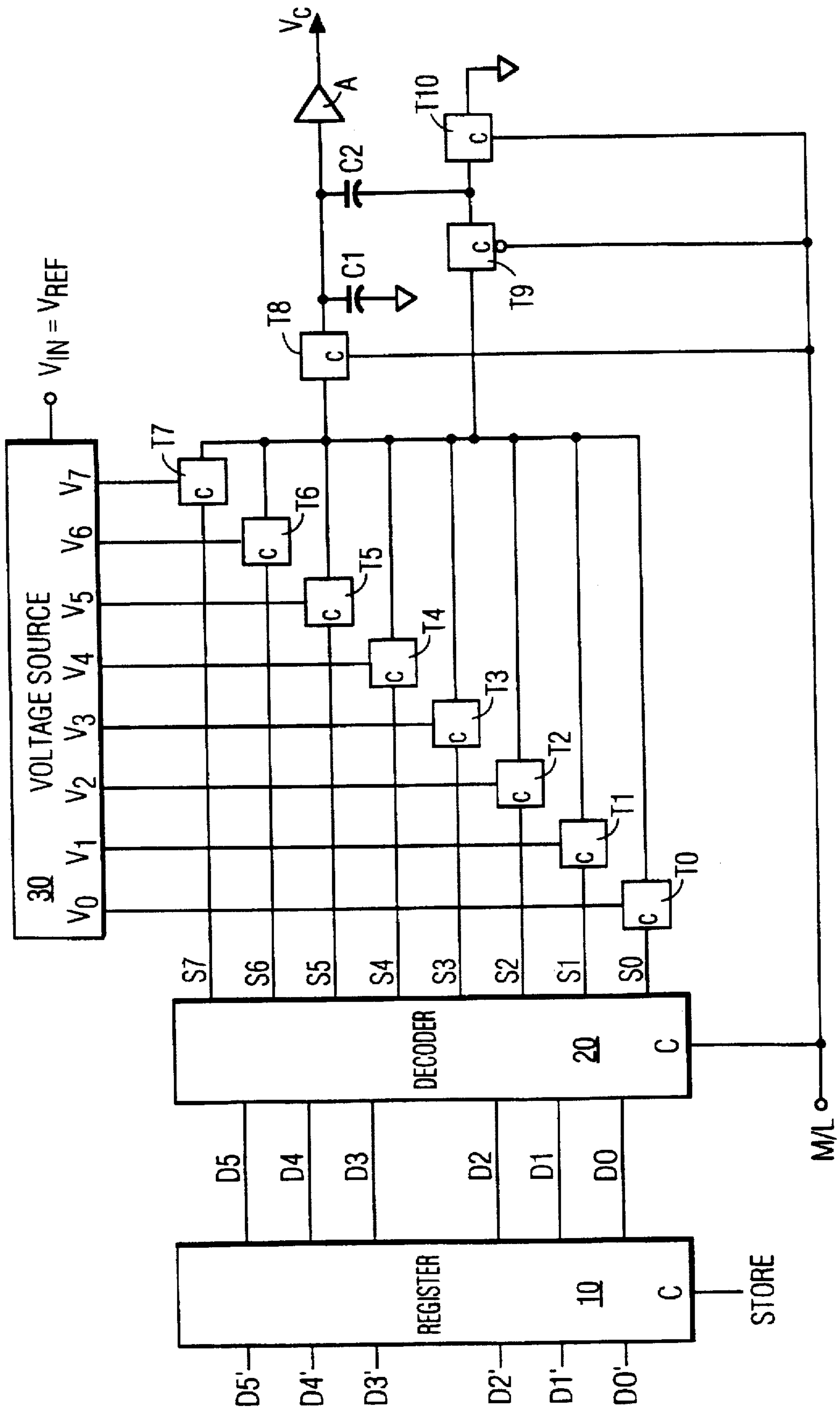
FIG. 3 is a schematic diagram of a second embodiment of a digital display driver in accordance with the invention.

FIG. 3 illustrates a second embodiment of a display driver in accordance with the invention which is substantially identical to that of FIG. 1, except for a simpler voltage source and a modified coupling arrangement. In this embodiment, only a single input voltage ($V_{IN}=V_{REF}$) is required for the source, which always produces (at its outputs $V_0, V_1, \ldots V_7$) the voltages listed in the column of Table I for the condition M/L=1.

Similarly to the embodiment of FIG. 1, the driver of FIG. 3 includes a coupling arrangement having the three switches T8, T9 and T10 for effecting charging of the capacitor C1. However, this coupling arrangement further includes a capacitor C2 which has a capacitance with a magnitude that is related to that of C1 in accordance with the equation:

$$\frac{C2}{C1+C2}=\frac{1}{8} \qquad (1)$$

Again referring to FIG. 2, it will be explained how the capacitor C2, together with the switches T8, T9 and T10, cooperate to charge the capacitor C1 during the data conversion cycle having the period T'. As in the example for the first embodiment, it will be assumed that the data code D5',D4',D3',D2',D1',D0' (having the value 010101) has just been stored in the register 10.

As soon as the signal M/L changes to the logical ONE state, the decoder 20 activates the first set of inputs and produces the switching signal S2 (corresponding to the code 010 being received at these inputs). As in the first embodiment, this causes the switch T2 to provide a low-impedance path from the voltage source output $V_2$ and through switch T8 (which is in its low-impedance state) to the first electrodes of capacitors C1 and C2 (which are commonly connected). While the signal M/L remains in the logical-ONE state, these two capacitors are electrically connected in parallel, with the second electrode of C1 being directly connected to ground and the second electrode of C2 being connected to ground through the low-impedance path of switch T10. Thus, both capacitors charge to the voltage ¼ $V_{REF}$, which is being provided at the $V_2$ output of the voltage source 30.

During the second part of the period T', when the signal M/L changes to the logical ZERO state, the decoder 20 activates the second set of inputs and produces the switching signal $S_5$ (corresponding to the code 101 being received at these inputs). As in the first embodiment, this causes the switch to provide a low-impedance path from the voltage source output $V_5$ and through switch $T_9$. In this second embodiment, however, output $V_5$ produces the voltage ⅝ $V_{REF}$ and this output is coupled to the first electrode of capacitor C1 through the capacitor C2. These capacitors are now connected in series and function as a voltage divider with C2 charging in the reverse direction from that in which it charged during the first part of the period T'. Because the capacitors have the relative values of capacitance set forth in Equation (1):

- the voltage across C2 changes negatively by ⅞ of the voltage produced by output $V_5$, i.e. from the voltage ¼ $V_{REF}$ to the voltage $\frac{1}{4} V_{REF}-(\frac{7}{8})(\frac{5}{8}) V_{REF}=\frac{1}{4} V_{REF}-\frac{35}{64} V_{REF}$.
- the voltage across C1 changes positively by ⅛ of the voltage produced by output $V_5$, i.e. from the voltage ¼ $V_{REF}$ to the voltage $\frac{1}{4} V_{REF}+(\frac{1}{8})(\frac{5}{8}) V_{REF}=\frac{1}{4} V_{REF}+\frac{5}{64} V_{REF}$.

Because the second electrode of capacitor C1 is referenced to ground potential, while the second electrode of capacitor C2 is referenced to the voltage at the output $V_5$ (i.e. ⅝ $V_{REF}$), the voltage produced at the driver's output $V_C$ is equal to $\frac{1}{4} V_{REF}+\frac{5}{64} V_{REF}$ or 2.1 volts, which is the same as the output of the first embodiment.

Although the invention is described with reference to only two exemplary embodiments, many alternatives are within the scope of the claims. For example, a six-bit data code is utilized in both embodiments, but virtually any number of bits may be utilized. In the simplest versions, codes having even numbers of bits will be utilized, with a first half of the bits representing a first analog signal level and with a second half of the bits representing a second analog signal level. Codes having odd numbers of bits can be accommodated simply, for example, by inactivating one of the decoder inputs. In the embodiments of FIGS. 1 and 3, for example, five-bit codes could be decoded by permanently applying a logical ZERO to the input of decoder 20 which is provided for receiving either bit D5 of D0, and by applying the codes to the remaining inputs. Also, code types other than binary may be used, by simply using a corresponding type of decoder.

Further, the number of groups of bits in a data code may be different than two, as are utilized in the disclosed embodiment of FIG. 3. For example, three groups of bits may be employed, with each group being converted in a different time interval. This approach would be especially useful for long codes, but additional capacitances are needed for added time intervals.

As another alternative, the order in which groups of bits are decoded may be changed from that described for the embodiments of FIGS. 1 and 3. This could be done, for example, simply by switching the decoder inputs to which the most and least significant groups of bits are applied.

I claim:

1. A digital display driver for producing analog signal levels for application to a data line of a matrix display apparatus, the signal levels being produced in response to successively presented, respective digital data codes representative of said signal levels, said driver comprising:

a. storage means for successively storing the digital data codes, each of said codes having at least one more-significant bit and at least one lesser-significant bit;

b. conversion means coupled to the storage means for, during a first time interval, producing a first analog signal level having a magnitude represented by the at least one more-significant bit of a stored code and for, during a second time interval, producing a second analog signal level having a magnitude represented by the at least one lesser-significant bit of said stored code;

c. capacitive means having a first electrode coupled to an output of the driver; and d. coupling means for coupling the conversion means to the capacitive means and for:

(1) during the first time interval, effecting charging of the capacitive means to a voltage determined by the first analog signal level; and (2) during the second time interval, effecting shifting of the first electrode voltage by a magnitude determined by the second analog signal level.

2. A digital display driver as in claim 1 where the capacitive means comprises a capacitor having the first electrode and a second electrode, said coupling means cooperating with the conversion means to produce said voltage shift by:

a. coupling the second electrode to a means for providing a reference potential during the first time interval; and b. coupling said second electrode to the conversion means when it is producing the second analog signal level during the second time interval.

3. A digital display driver as in claim 1 where the capacitive means comprises a first capacitor, having the first electrode, and a second capacitor, said coupling means cooperating with the conversion means to produce said voltage shift by:

a. coupling the first capacitor to the conversion means, during the first time interval, to effect charging of said first capacitor to the voltage determined by the first analog signal level; and b. coupling a voltage divider comprising the first and second capacitors to the conversion means, during the second time interval, to effect charging of the first capacitor to a voltage which is the sum of:

(1) the voltage determined by the first analog signal level; and (2) a voltage which is a predetermined fraction of the voltage determined by the second analog signal level.

4. A digital display driver as in claim 3 where the predetermined fraction is substantially equal to $2^{-N/2}$, where N equals the number of bits in each data code.

5. A digital display driver as in claim 1 where the at least one more significant bit includes the most significant bit.

6. A digital display driver as in claim 1 where the at least one lesser-significant bit includes the least significant bit.

7. A method of producing, at an output of a digital display driver, analog signal levels for application to a data line of a matrix display apparatus, the signal levels being produced in response to successively-presented, respective digital data codes representative of said signal levels, said method comprising:

a. storing the digital data codes, each of said codes having at least one more-significant bit and at least one lesser significant bit;

b. during a first time interval, producing a first analog signal level having a magnitude represented by the at least one more-significant bit of a stored code;

c. during a second time interval, producing a second analog signal level having a magnitude represented by the at least one lesser-significant bit of said stored code;

d. during the first time interval, effecting charging of capacitive means, having a first electrode coupled to the output, to a voltage determined by the first analog signal level; and e. during the second time interval, effecting shifting of the first electrode voltage by a magnitude determined by the second analog signal level.

8. A method as in claim 7 where the capacitive means comprises a capacitor having the first electrode and a second electrode, said voltage shift being produced by:

a. coupling the second electrode to a means for providing a reference potential during the first time interval; and b. coupling said second electrode to means for producing the second analog signal level during the second time interval.

9. A method as in claim 7 where the capacitive means comprises a first capacitor, having the first electrode, and a second capacitor, said voltage shift being produced by:

a. coupling the first capacitor to means for producing the first analog signal level during the first time interval; and b. coupling a voltage divider comprising the first and second capacitors to means for producing the second analog signal level, during the second time interval, to effect charging of the first capacitor to a voltage which is the sum of:

(1) the voltage determined by the first analog signal level; and (2) a voltage which is a predetermined fraction of the voltage determined by the second analog signal level.

10. A digital display driver as in claim 9 where the predetermined fraction is substantially equal to $2^{-N/2}$, where N equals the number of bits in each data code.

11. A digital display driver as in claim 7 where the at least one more significant bit includes the most significant bit.

12. A digital display driver as in claim 7 where the at least one lesser-significant bit includes the least significant bit.

13. A digital display driver for producing analog signal levels for application to a data line of a matrix display apparatus, the signal levels being produced in response to successively-presented, respective digital data codes representative of said signal levels, said driver comprising:

a. storage means for successively storing the digital data codes, each of said codes having at least a first bit and at least a second bit;

b. conversion means coupled to the storage means for, during a first time interval, producing a first analog signal level having a magnitude represented by at least the first bit of a stored code and for, during a second time interval, producing a second analog signal level having a magnitude represented by the at least the second bit of said stored code;

c. capacitive means having a first electrode coupled to an output of the driver; and d. coupling means for coupling the conversion means to the capacitive means and for:

(1) during the first time interval, effecting charging of the capacitive means to a voltage determined by the first analog signal level; and (2) during the second time interval, effecting shifting of the first electrode voltage by a magnitude determined by the second analog signal level.

* * * * *